(12) United States Patent
Wong

(10) Patent No.: US 7,250,890 B1
(45) Date of Patent: Jul. 31, 2007

(54) AREA-EFFICIENT, DIGITAL VARIABLE RESISTOR WITH HIGH RESOLUTION

(75) Inventor: Neng-Tze Wong, Sunnyvale, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 11/311,719

(22) Filed: Dec. 19, 2005

(51) Int. Cl.
*H03M 1/78* (2006.01)
(52) U.S. Cl. ..................... 341/154; 341/144
(58) Field of Classification Search ............... 341/144, 341/154
See application file for complete search history.

(56) References Cited

U.S. PATENT DOCUMENTS

| | | | |
|---|---|---|---|
| 5,396,245 A | 3/1995 | Rempfer | |
| 5,495,245 A | 2/1996 | Ashe | |
| 5,617,091 A * | 4/1997 | Uda | 341/154 |
| 5,859,606 A * | 1/1999 | Schrader et al. | 341/144 |
| 6,288,661 B1 * | 9/2001 | Holberg | 341/145 |
| 6,448,916 B1 | 9/2002 | Leung | |
| 6,552,519 B1 * | 4/2003 | Nazarian | 323/354 |
| 6,900,752 B2 * | 5/2005 | Oda et al. | 341/154 |
| 7,095,347 B2 * | 8/2006 | Hirata et al. | 341/144 |
| 2006/0109156 A1 * | 5/2006 | Colbeck et al. | 341/154 |

\* cited by examiner

*Primary Examiner*—Linh Nguyen
(74) *Attorney, Agent, or Firm*—North Weber & Baugh LLP (57) ABSTRACT

A system, apparatus and method for providing a digital variable resistor with high resolution and efficient use of substrate area is described. In one embodiment of the invention, a digital variable resistor string comprises a serial array of resistors that is connected to a parallel array of resistors through a switching network. A compensation network is coupled in parallel to the parallel array of resistors in order to compensate for resistance drift caused by non-linear responses of components within the variable resistor. For example, the compensation network may interpolate the digital variable resistor to a preferred resistance value that is within an error margin tolerance.

20 Claims, 5 Drawing Sheets

AREA-EFFICIENT, DIGITAL VARIABLE RESISTOR WITH HIGH RESOLUTION

BACKGROUND

A. Technical Field

The present invention relates generally to digital variable resistance, and more particularly, to a digital variable resistor string that provides high resolution and efficient substrate area use.

B. Background of the Invention

Various electrical devices may require that certain resistance values vary in order to change electrical characteristics of the device. A digital potential meter operating in a variable resistor mode may vary its internal resistance characteristics using a plurality of resistors that are coupled together serially by a switching network. This resistor string varies its effective resistance relative to which transmission gates within the switching array are closed or open.

A decoder-based digital-to-analog ("DAC") converter may also comprise a serial resistor string that provides taps to create different voltage levels between high and low voltages for the conversion processes. This serial resistor string effectively operates as a voltage divider in which a voltage level is defined according to which resistors within the resistor string are electrically coupled by binary switches within the system.

Figure 1:
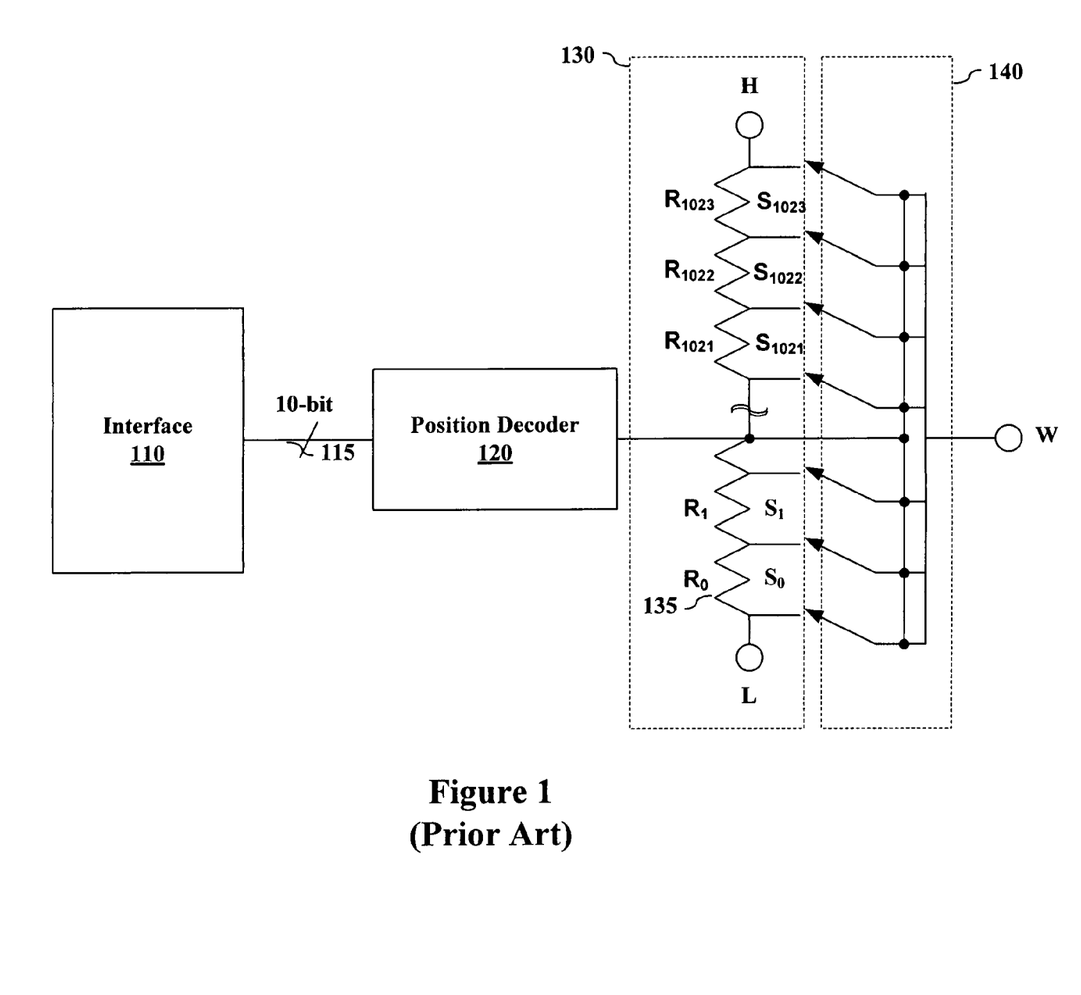
FIG. 1 is an illustration of a resistor string in series that may be used to implement a digital potential meter in variable resistor mode.

FIG. 1 illustrates an example of such a serial resistor string that is controlled by a 1024 position decoder. An interface 110 provides a signal on a 10-bit data bus 115 to a position decoder 120. The position decoder is electrically coupled to a switching network 140 comprising a number of transmission gates and a serial resistor string 130. The switching network 140 may be coupled to the serial resistor string in a tree configuration in which a single path connects a particular resistor to an output node or interface. Typically, each resistor within the serial resistor string has approximately the same resistance.

The switching network 140 and serial resistor string 130 provide an effective resistance by opening and closing transmission gates which electrically couple resistors in series. For example, a resistance value of 4R may be created by coupling $R_0$, $R_1$, $R_2$ and $R_3$ (all having equal resistance values) together in series by closing the appropriate gates within the switching network 140. In turn, a corresponding voltage level is created within the system in which the resistor string is located.

Certain applications in which resistor strings are employed require a relatively high resolution. One method in which higher resolution may be achieved is by reducing the resistance values of the resistors within the resistor string. If on-chip resistors are used within the string, then this reduction in resistance value causes each resistor to increase its relative width, which also results in increasing the size of the resistor contacts. In order to maintain a preferred temperature coefficient, the ratio of contact resistance to the total unit resistance is typically less than 20%, which may limit the length of the resistor. Accordingly, if fine resolution is desired, a series unit resistor string may require a very large area.

One skilled in the art will recognize that particular problems become apparent when the width of on-chip resistors increases. The increased width in each of the resistors may result in the resistor string occupying a relatively large area of a substrate on which the string is integrated. The gradient of the substrate within this large area occupied by the resistor string may also cause performance issues. Additionally, the characteristics of the wide resistor contacts, and corresponding routing metals, may fluctuate relative to temperature variations and contribute a significant amount of resistance to the resistor itself.

The differential non-linearity of a digital variable resistor may be measured in relation to wiper resistance caused by switches adjacent to the resistor. Furthermore, these switches or wiper components may have poor temperature coefficients which may further degrade the performance of the resistor string. In order to reduce the amount of wiper resistance, larger switches are integrated within the switching network resulting in a further demand on substrate surface area.

SUMMARY OF THE INVENTION

A digital variable resistor with improved resolution and substrate surface area requirements is described. In one embodiment of the invention, the digital variable resistor comprises a serial array of resistors, a parallel array of resistors and a compensation network. These resistor arrays and compensation network may be electrically coupled by various types of switches and/or switching networks. Each of the resistors within the arrays has a relatively higher resistance value than the resistive steps provided by the variable resistor.

In one embodiment of the invention, the compensation network is coupled in parallel to the parallel array of resistors in order to compensate for resistance drift caused by non-linear responses of components within the variable resistor. For example, the compensation network may interpolate the digital variable resistor's resistance to a preferred resistance value that is within an acceptable margin of error. This interpolation may be performed by connecting in parallel certain resistors that further reduce the equivalent resistance of the digital variable resistor. In one embodiment, the compensation network comprises a plurality of compensation elements. Each of these compensation elements, or combinations thereof, may be associated with a particular resistor configuration within either the serial or parallel resistor arrays or both and provide an appropriate interpolation.

Various connections between the serial array of resistors and parallel resistors and compensation network are provided by the present invention. For example, a switching array coupling the serial resistors and the parallel resistors may be designed to reduce the number of resistors within the digital variable resistor and yet still provide N resistance value steps at a particular resolution.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

A system, apparatus and method for providing a digital variable resistor with high resolution and efficient use of substrate surface area is described. In one embodiment of the invention, the digital variable resistor comprises a serial array of resistors, a parallel resistor array and a compensation network. The resistor arrays and compensation network may be electrically coupled in various configurations to provide a particular equivalent resistance or voltage level on the digital variable resistor. Each of the resistors within the serial and parallel resistor arrays has a relatively higher resistance value than the resistance steps provided by the digital variable resistor.

In one embodiment of the invention, the compensation network is coupled in parallel to the parallel array of resistors in order to compensate for non-linear responses within the digital variable resistor and to interpolate to a preferred resistance value that is within a desired margin of error. For example, a compensation element within the compensation network may comprise a particular voltage divider that is coupled in parallel with the parallel array of resistors in order to adjust the equivalent resistance of the resistor string to a value within a preferred error margin.

Various connections between the serial array of resistors and parallel resistors and compensation network are provided by the present invention. For example, a switching array coupling the serial resistors and the parallel resistors may be designed to reduce the number of resistors within the resistor string and yet still provide N steps of high resolution.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different systems and devices including digital potential meters and DACs. Structures and devices shown below in block diagram are illustrative of exemplary embodiments of the invention and are meant to avoid obscuring the invention. Furthermore, connections between components and/or modules within the figures are not intended to be limited to direct connections. Rather, data between these components and modules may be modified, reformatted or otherwise changed by intermediary components and modules.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. System Overview

Figure 2:
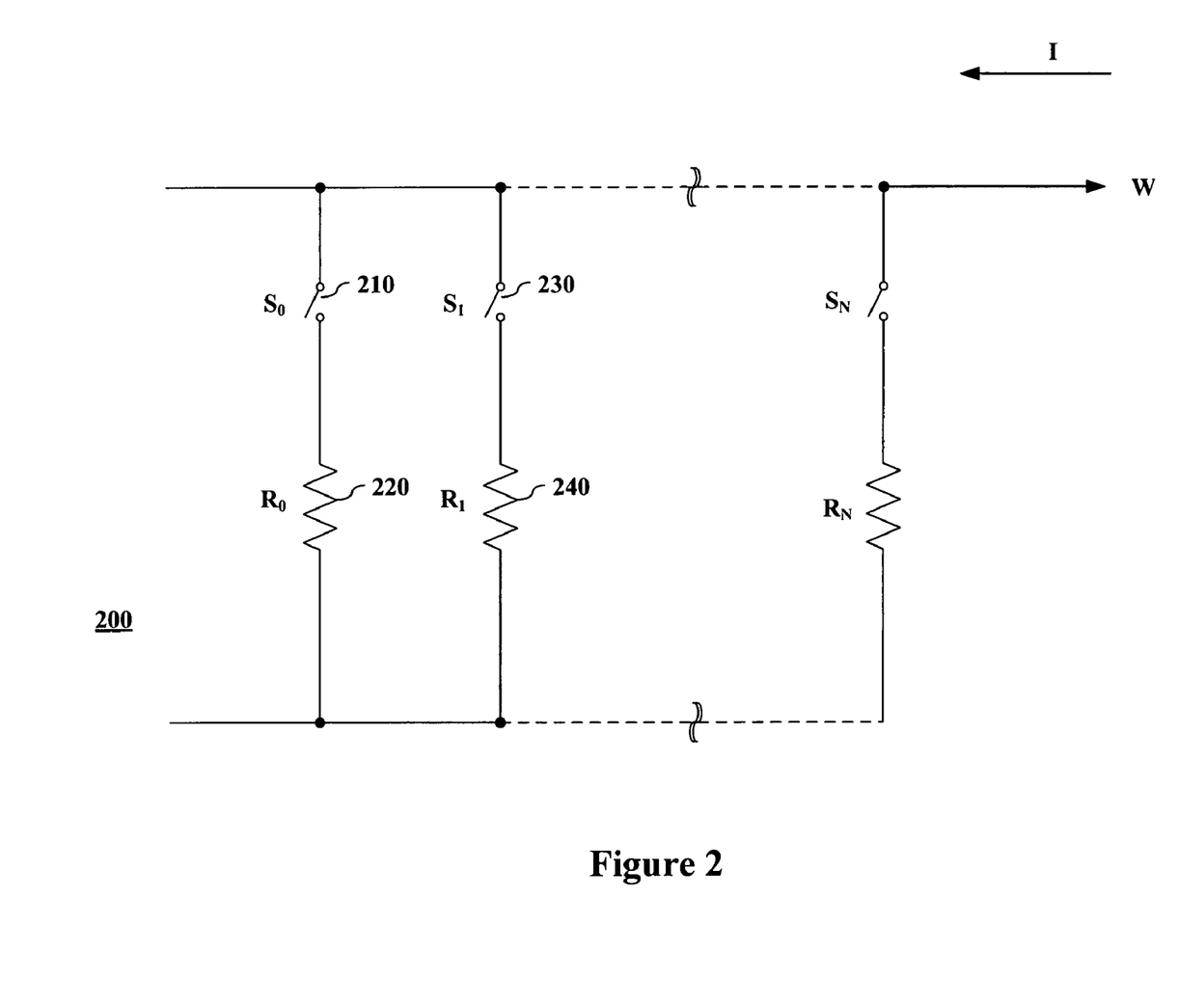
FIG. 2 is an exemplary illustration of a switch controlled voltage divider that provides a particular resistance resolution according to one embodiment of the invention.

FIG. 2 is a general block diagram illustrating an array of resistors with corresponding switches that are coupled in parallel so that a plurality of different voltage dividers may be created. In one embodiment, each resistor within the parallel array has an associated switch that may be open or closed to allow current to travel through the resistor. By controlling each of these switches, a resistor with a particular value may be created to generate an equivalent resistance for the parallel resistors. Accordingly, a low resistive value may be established using parallel resistors with larger resistance values and smaller widths.

Referring to FIG. 2, an equivalent resistance 200 between nodes A and B is defined in relation to the number of resistors that are coupled in parallel by corresponding switches behind the nodes. For example, a resistance between the nodes would be equal to the resistance of resistor $R_0$ 220 when $S_0$ 210 is closed. However, the equivalent resistance between the nodes may be reduced by approximately 50% by switching on switch $S_1$ 230 to electrically couple and $R_1$ 240 in parallel to $R_0$ 220. The equivalent resistance 200 between points A and B is:

$$R_{AB} = R_0 R_1 / (R_0 + R_1)$$

If $R_0 = R_1$ then $R_{AB} = R_0/2$

The equivalent resistance between nodes A and B may be incrementally stepped down according to the value of the resistors and the number of resistors within the parallel resistor array. For example, if all of the resistors are equal and all of the switches are turned on then the parallel resistance is defined as:

$R_{AB} = R_0/N$ where N is the total number of resistors in the parallel array.

The above-described equivalent resistance may begin to exhibit non-linear characteristics as the number of resistors and other electrical components within the parallel array is increased. These non-linear responses may cause the actual equivalent resistance to drift outside of a preferred margin of error and fail to provide sufficient resolution between different steps.

According to one embodiment of the invention, this drift in equivalent resistance may be compensated for by a compensation network that is coupled in parallel with the parallel resistor array.

B. Parallel Compensation Network

Figure 3:
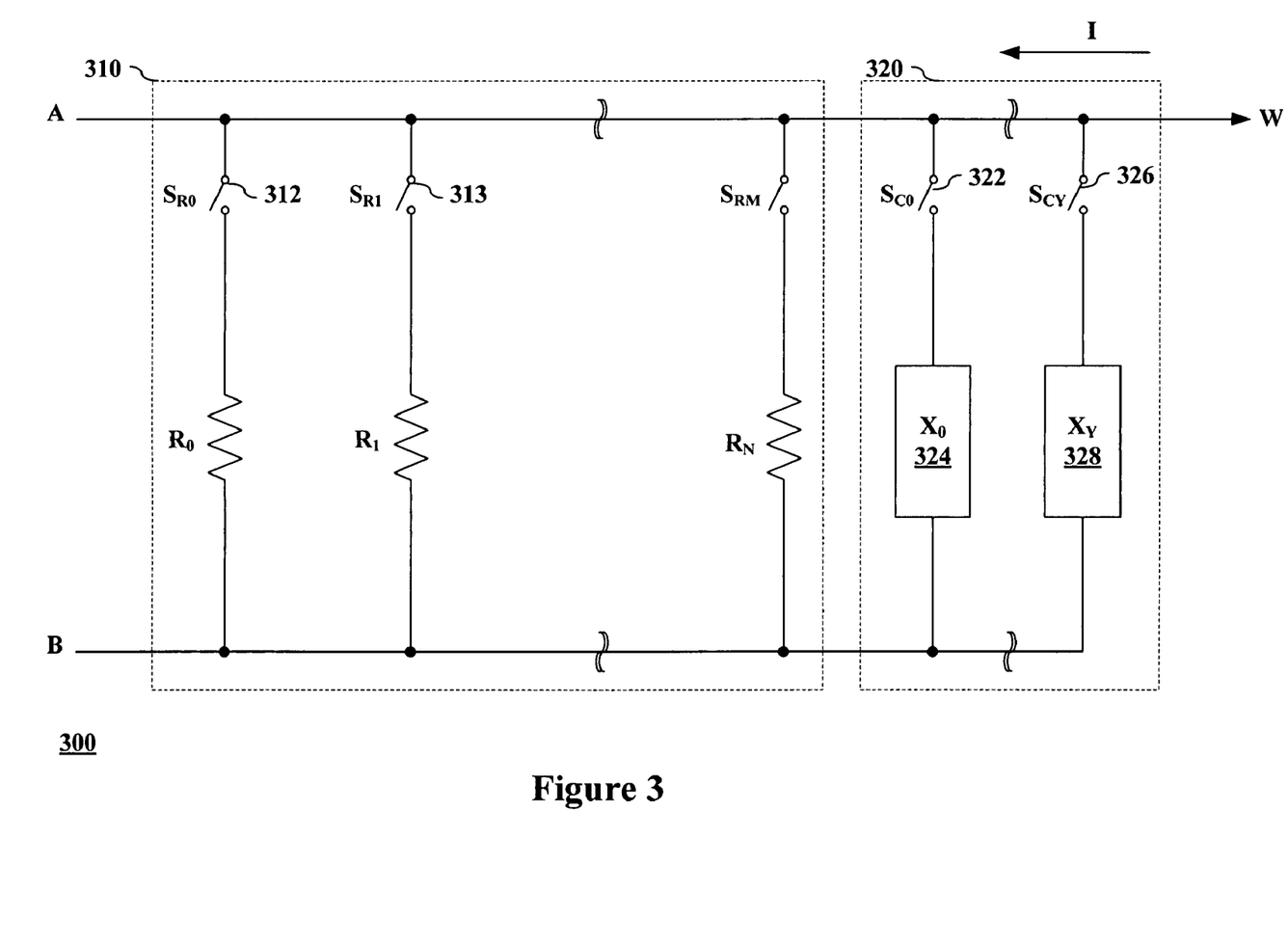
FIG. 3 is an exemplary illustration of a switch controlled voltage divider with attached compensation according to one embodiment of the invention.

FIG. 3 illustrates a compensation network 320, having M elements, that is coupled in parallel with a parallel resistor string 310 according to one embodiment of the invention. Each element within the compensation network 320 may be designed to decrease the equivalent resistance between nodes A and B by introducing additional resistance within the parallel resistor string 310.

In one embodiment of the invention, a first switch $S_{C0}$ 322 within the compensation network 320 electrically couples a first compensation element $X_0$ 324 to the parallel resistor string 310. The compensation network 320 may have Y number of compensation elements ending with final compensation element $X_Y$ 328 and corresponding switch $S_{CY}$ 326.

The compensation network 320 may be modeled so that a compensation element or combination of compensation elements is associated with a particular number of electrically coupled resistors within the parallel resistor string 310. For example, if N number resistors are electrically connected by corresponding switches within the parallel resistor string 310, the differential non-linear effects of the coupled resistors may be predicted. Accordingly, a compensation element or combination of compensation elements within the compensation network 320 may also be electrically coupled in parallel with the parallel resistor string to off-set at least a portion of the non-linear effects in order to bring the equivalent resistance within an acceptable margin of error.

For example, if switches $S_{R0}$ 312 and $S_{R1}$ 313 within the parallel resistor array 310 and switch $S_{C0}$ 322 within the compensation network 320 are turned on, then the equivalent resistance between nodes A and B would be equal to:

$$R_{AB} = R_{0//}R_{1//}X_0 = \frac{1}{\frac{1}{R_0} + \frac{1}{R_1} + \frac{1}{X_0}}$$

If $R_0 = R_1$, $X_0 = 2R_0$, then $R_{AB} = \frac{1}{\frac{2}{R_0} + \frac{0.5}{R_0}} = \frac{R_0}{2+0.5} = \frac{R_0}{N+X}$ Wherein $X_0$ is the compensation value that compensates for non-linearities and causes the equivalent resistance to fall within a preferred margin of error. For example, if N is equal to 2 and X is equal to 0.5, the equivalent resistance $R_{AB}$ would be equal to $R_0/2.5$, fractionally between $R_0/2$ and $R_0/3$.

One skilled in the art will recognize that the compensation elements may have various structures including a resistor or resistors that are inserted in parallel with the parallel resistor string 310, which effectively operate as additional fractional resistor divider that modify the equivalent resistance of the system. Furthermore, the connections, including switching structure, between the parallel resistor string 310 and the compensation network 320 may be accomplished in numerous manners including a parallel connection as described above.

C. High Resolution Resistor String with Compensation

Figure 4:
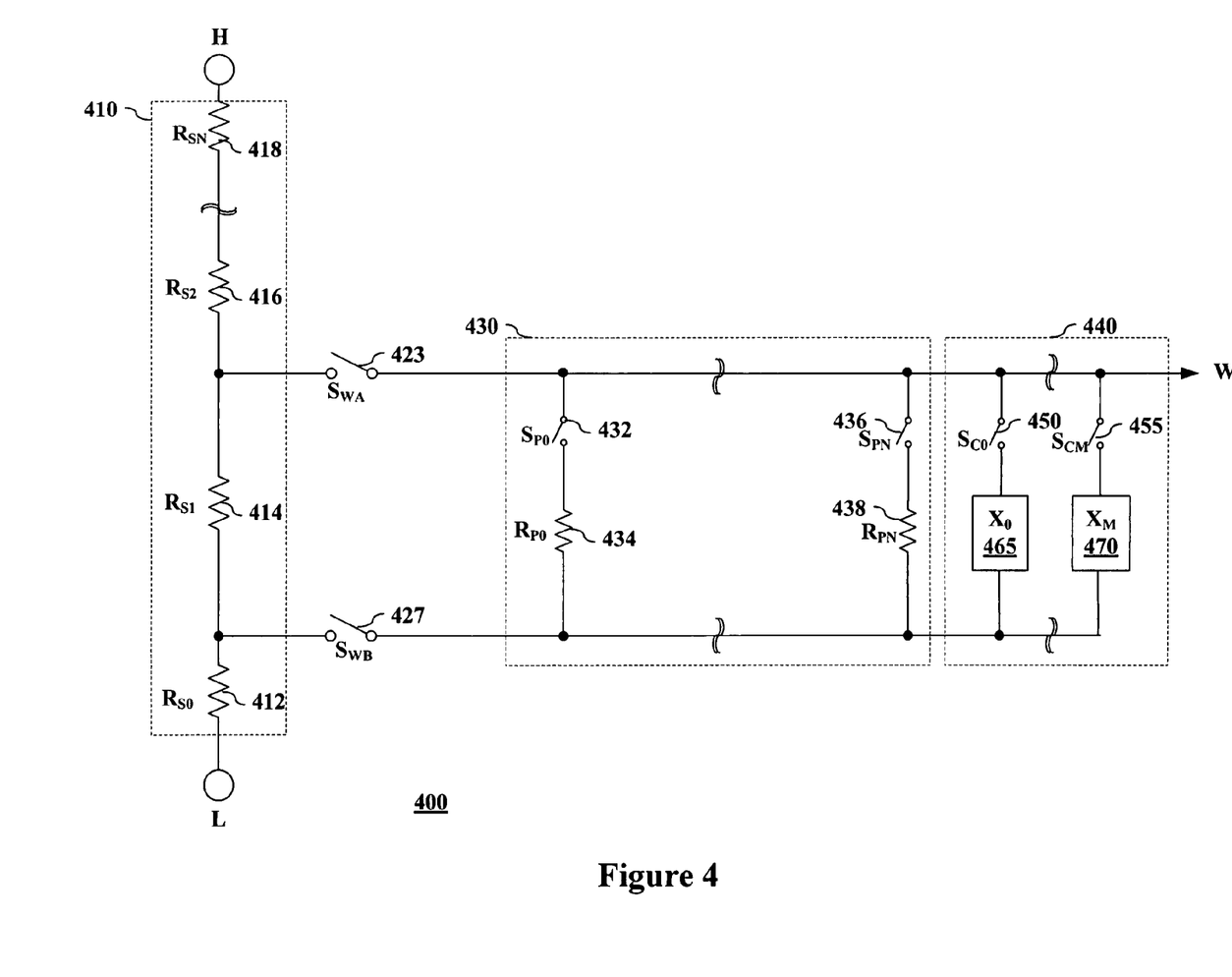
FIG. 4 is a diagram of a digital variable resistor string having both serial resistors and parallel resistors according to one embodiment of the invention.

FIG. 4 illustrates a digital variable resistor string that includes a compensation network according to one embodiment of the invention. The resistor string 400 comprises a serial resistor array 410, a parallel resistor array 430, and a compensation network 440.

The serial resistor array 410 includes N number of resistors, including $R_{S0}$ 412, $R_{S1}$ 414, $R_{S2}$ 416 up to $R_{SN}$ 418 that are coupled together in series. One or more switches may be positioned between each of the resistors within the serial resistor array 410 to allow an equivalent resistance to be stepped by a resistive unit by turning the switches on or off.

In one embodiment of the invention, the serial resistor array 410 may be coupled to the parallel resistor array 430 by a switching network. As illustrated in FIG. 4, the switching network comprises two large wiper switches $S_{WA}$ 423 and $S_{WB}$ 427 that couple the parallel resistor array 430 in parallel with at least one resistor within the serial resistor array 410. Typically, the impendence between nodes A and B will be relatively large which will minimize the effects of the large resistance caused by the two wiper switches $S_{WA}$ 423 and $S_{WB}$ 427. For example, as shown in this figure, the parallel resistor array 430 is coupled in parallel with resistor $R_{S1}$ 414. One skilled in the art will recognize that the parallel resistor array 430 may be coupled in parallel to each of the resistors within the serial resistor array 410. Furthermore, the parallel resistor array 430 may also be coupled in parallel to a plurality of resistors within the serial resistor array 410.

One manner in which the parallel resistor array 430 and serial resistor array 410 may be connected is via a switching network. One example of such a switching network between the serial resistor array 410 and the parallel resistor array 430 is described in more detail later.

The parallel resistor array 430 comprises a plurality of resistors that are coupled in parallel as well as corresponding switches that effectively couple particular resistors into the parallel array. In one embodiment, the structure of the parallel resistor array 430 is as described above in which each resistor has an associated switch that electrically couples it into the array as illustrated relative to resistor $R_{P1}$ 434 and switch $S_{P1}$ 432, and resistor $R_{PN}$ 438 and switch $S_{PN}$ 436. The parallel resistor array 430 may be reused by each resistor within the serial resistor array 410 through the switching network. This reuse of resistors decreases the number of resistors required within the variable resistor and provides a more efficient use of substrate surface area. Furthermore, because the resistors are relatively larger than the resistive steps of the digital variable resistor, the physical size (in particular the width) of the resistors is reduced. Accordingly, the area on a semiconductor substrate that is required to implement the digital variable resistor is reduced.

The compensation network 440 is coupled in parallel with the parallel resistor array 430 and comprises a plurality of compensation elements. In one embodiment, the compensation network 440 has compensation elements $X_0$–$X_M$ 465, 470 and corresponding switches $S_{C0}$–$S_{CM}$ 450, 455. One skilled in the art will recognize that various switching structures and networks may be employed in order to provide a variable compensation value to the parallel switching array 430. As mentioned above, the compensation network 440 may be modeled to compensate for various predicted non-linear responses of the parallel switching array 430. For example, compensation elements within the compensation network 440 may comprise various resistor configurations that would effectively compensate for various non-linear responses. In one embodiment, each compensation element has a unique resistance divider configuration that may provide a particular reduction of equivalent resistance between nodes A and B.

D. N+M Bit Variable Resistor with High Resolution

Figure 5:
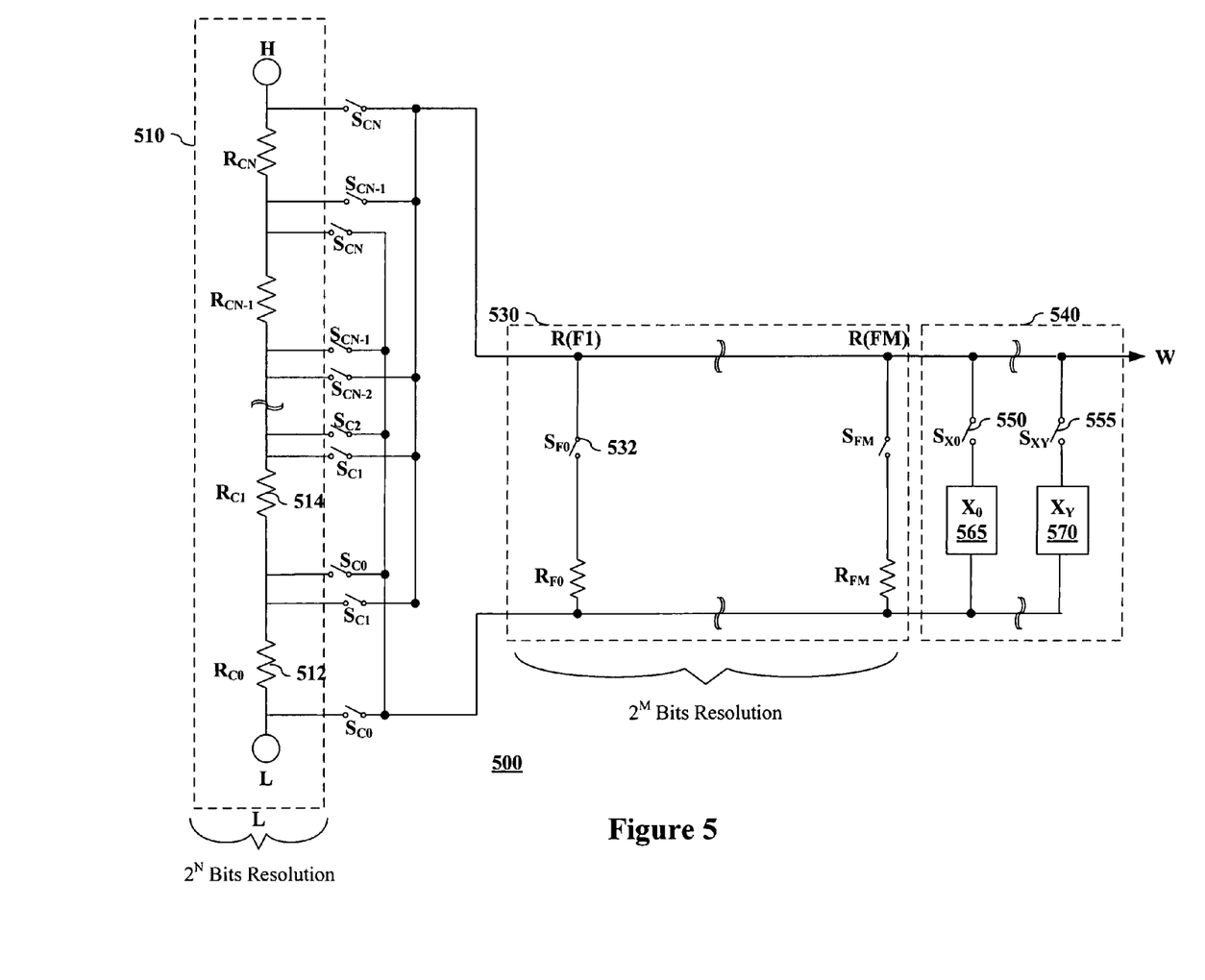
FIG. 5 illustrates a digital variable resistor string having a hybrid connection of parallel resistors with serial resistors according to one embodiment of the invention.

FIG. 5 illustrates an N+M bit variable resistor with high resolution according to one embodiment of the invention. In particular, the variable resistor 500 provides high resolution using a serial resistor array 510 that is coupled to a parallel resistor array 530 using a switching network. A compensation network 540 is coupled in parallel to the parallel resistor array 530 to compensate for non-linear responses of the variable resistor 500.

The serial resistor array 510 contains N resistors, $R_{C0}$–$R_{CN}$, coupled in series. In one embodiment, each of the N resistors has a resistance value $R_c$ which may be electrically coupled in series with each other. The serial resistor array 510 is also coupled to the parallel resistor array 530 by a switching network, which allows one or more of the individual resistors within the serial resistor array 510 to be coupled in parallel with the parallel resistor array 530. One skilled in the art will recognize that numerous switching network configurations and structures may be used including the example described below.

In one embodiment of the invention, each resistor within the serial resistor array 510 has two associated switches that electrically couple a resistor within the parallel resistor array 530. The resistors that are coupled in series provide coarse resistance value and the resistors that are coupled in parallel with the serially coupled resistors refine the resistance value and provide the high resolution of the system. For example, $R_{C0}$ 512 may be coupled in parallel to the parallel resistor array 530 by switches $S_{C0}$. $R_{C1}$ 514 may be coupled in series with $R_{C0}$ through a switch (not shown) and coupled in parallel with the parallel resistor array 530 via switches $S_{C1}$. The other switches within the serial resistor array 510 may be electrically coupled serially and parallel with the other resistors in a similar manner. Accordingly, the resistance width to length ratio may incrementally be stepped up or down according to which resistors are electrically coupled within the serial resistor array 510 and the parallel resistor array 530.

In one embodiment of the invention, the parallel resistor array 530 contains a plurality of resistor stages R(F1)–R(FM) which provide resolution to the voltage level steps. In this particular example, each stage has an approximate resistance value of an integer multiple of $R_c$, such as $10*R_c$, when electrically coupled and contains a switch and a resistor. For example, the first parallel stage includes a switch $S_{F0}$ 532 and a resistor $R_{F0}$ 534. These resistor stages may be coupled, in various combinations, to one or more resistors within the serial resistor array 510, in order to provide variable resistance/voltage steps. One skilled in the art will recognize that each of the resistor stages may comprise various components that effectively function as a voltage divider and provide tuning of equivalent resistance within the particular system in which the invention resides. Furthermore, the reuse of the parallel resistor array 530 significantly reduces the number of resistors required to implement the 10-bit resistor string. One skilled in the art will recognize that the combination of the serial resistor array 510 having N-bit ($2^N$ steps of resistance value, $R_c$) and the parallel resistor array 530 having M-bit ($2^M$ steps of resistance value, $R_f$) provides (with each $R_f = 1/2^N R_c$) N+M bit resolution ($2^{(N+M)}$ steps of resistance value).

The compensation network 540 compensates for non-linear responses to the serial resistor array 510, the parallel resistor array 530 or combination thereof. As described above, one embodiment of the invention comprises a plurality of compensation elements, $X_0$ 565 through $X_Y$ 570, and associated switches $S_{X1}$ 550 through $S_{XY}$ 555. These switches may electrically couple one or more of the compensation elements to either the serially resistor array 510, the parallel resistor array 530 or combination thereof in order to bring an equivalent resistance or voltage level within a margin error. Furthermore, the switches and/or switching network that electrically couples the compensation elements within a system may be designed and configured in numerous ways.

While the present invention has been described with reference to certain exemplary embodiments, those skilled in the art will recognize that various modifications may be provided. Accordingly, the scope of the invention is to be limited only by the following claims.

I claim:

1. A digital variable resistor comprising:
a serial resistor array having a first plurality of resistors that are electrically coupled in series;
a parallel resistor array having a second plurality of resistors that can be electrically coupled in parallel by a first plurality of switches;
a compensation network that can be electrically coupled to the parallel resistor array and adjusts at least one characteristic of the digital variable resistor within a margin of error; and
a switching network having a second plurality of switches that couples the parallel resistor array in parallel with at least one resistor from the first plurality of resistors.

2. The digital variable resistor of claim 1 wherein each resistor within the first plurality of resistors has the same resistance value.

3. The digital variable resistor of claim 2 wherein each resistor value within the second plurality of resistors is larger than and an integer multiple of each resistor value within the first plurality of resistors.

4. The digital variable resistor of claim 2 wherein the compensation network provides an effective resistance value equal to an integer multiple of the resistance value of each resistor within the second plurality of resistors plus a rational fraction.

5. The digital variable resistor of claim 1 wherein the switching network comprises at least two wiper switches attached to one resistor.

6. The digital variable resistor of claim 1 that operates up to N+M bit resolution.

7. The digital variable resistor of claim 1 wherein the switching network comprises two switches associated with each resistor within the first plurality of resistors and that can couple each resistor in parallel to the parallel resistor array.

8. The digital variable resistor of claim 1 wherein the compensation network comprises a plurality of compensation elements and associated switches.

9. The digital variable resistor of claim 8 wherein each compensation element within the plurality of compensation elements operates as a fractional resistor divider to compensate for resistance drifts caused by non-linear responses.

10. The digital variable resistor of claim 8 wherein the compensation network is configured to compensate for a plurality pre-defined resistance drifts caused by different resistor coupling configurations of the digital variable resistor.

11. A compensation network for adjusting non-linear resistance drift within a resistor string, the network comprising:
an interface to electrically couple the compensation network in parallel with the resistor string;
a first compensation element that may be coupled in parallel with the resistor string and that compensates for a first resistance drift by coupling a first fractional resistor divider into the resistor string; and
a second compensation element that may be coupled in parallel with the resistor string that compensates for a second resistance drift by coupling a second fractional resistor divider into the resistor string.

12. The compensation network of claim 11 further comprising:
a first switch that electrically couples the first compensation element in parallel with the resistor string; and
a second switch that electrically coupled the second compensation element in parallel with the resistor string and first compensation element.

13. The compensation network of claim 11 wherein the compensation network can be electrically coupled in parallel to a serial resistor array via a parallel resistor array.

14. The compensation network of claim 11 wherein the first compensation element comprises a fractional resistor divider.

15. The compensation network of claim 11 wherein the first compensation element and the second compensation element provide an effective resistance equal to an integer value plus a rational fraction.

16. A method of providing a digital variable resistor, the method comprising:

provided a first plurality of resistors that can be coupled together in series;

coupling a second plurality of resistors in parallel with at least one resistor within the first plurality of resistors; and coupling a compensation network to at least one resistor in the second plurality of resistors in order to compensate for non-linear resistance drift.

17. The method of claim 16 wherein the first plurality of resistors is coupled in parallel to the second plurality of resistors by a switching network.

18. The method of claim 16 wherein the first plurality of resistors is coupled in parallel to the second plurality of resistors by at least two wiper switches.

19. The method of claim 16 wherein the compensation network comprises:

a plurality of compensation elements that can be coupled together in parallel; and wherein each compensation element within the plurality of compensation elements is designed to compensate for a particular resistance drift caused by a coupling of the first plurality of resistors and the second plurality of resistors.

20. The method of claim 16 wherein the compensation network provides an effective resistance equal to an integer value plus a rational fraction.

* * * * *